United States Patent
Lee et al.

(10) Patent No.: US 8,164,252 B2
(45) Date of Patent: Apr. 24, 2012

(54) ORGANIC LIGHT EMITTING DIODE DISPLAY APPARATUS AND METHOD OF MANUFACTURING THE SAME

(75) Inventors: Dae-Woo Lee, Yongin (KR); Do-Hyun Kwon, Yongin (KR); Dae-Woo Kim, Yongin (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 8 days.

(21) Appl. No.: 12/458,371

(22) Filed: Jul. 9, 2009

(65) Prior Publication Data

US 2010/0007271 A1     Jan. 14, 2010

(30) Foreign Application Priority Data

Jul. 11, 2008   (KR) .................. 10-2008-0067829

(51) Int. Cl.
    *H01J 1/64*   (2006.01)
(52) U.S. Cl. .......................................... 313/504; 445/23
(58) Field of Classification Search .......... 313/503–506; 445/23–25
    See application file for complete search history.

(56) References Cited

U.S. PATENT DOCUMENTS

2005/0269946 A1 *  12/2005   Jeong et al. ................ 313/504

FOREIGN PATENT DOCUMENTS

JP         2007-287346 A      11/2007

* cited by examiner

*Primary Examiner* — Joseph L Williams
(74) *Attorney, Agent, or Firm* — Lee & Morse, P.C.

(57) ABSTRACT

An organic light emitting diode (OLED) display apparatus, including a substrate, at least one thin film transistor (TFT) on the substrate, an insulating layer covering the at least one TFT and having a via hole and a groove, a first electrode on the insulating layer and electrically connected to the at least one TFT through the via hole, a pixel define layer on the first electrode and the groove, the pixel define layer having an opening that exposes the first electrode; an intermediate layer electrically connected to the first electrode through the opening, the intermediate layer including an organic emissive layer, and a second electrode on the intermediate layer. The organic emissive layer may be easily formed in the opening because a step between the organic emissive layer and the pixel define layer may be reduced as a portion of pixel define layer fills the groove.

9 Claims, 5 Drawing Sheets

ORGANIC LIGHT EMITTING DIODE DISPLAY APPARATUS AND METHOD OF MANUFACTURING THE SAME

BACKGROUND OF THE INVENTION

1. Field

The present invention relates to an organic light emitting diode (OLED) display apparatus and a method of manufacturing the same and, more particularly, to an OLED display apparatus that enables an organic emissive layer to be easily formed.

2. Description of the Related Art

In recent years, conventional display apparatuses have been replaced by portable thin flat panel display apparatuses. Self-emitting display apparatuses of organic or inorganic light emitting display apparatuses have advantages over other flat panel display apparatuses because organic or inorganic light emitting display apparatuses provide a wide viewing angle, provide a good contrast, and have a rapid response speed. Therefore, organic or inorganic light emitting display apparatuses have been receiving spotlight as the next generation display apparatuses. In particular, OLED display apparatuses including a light-emitting layer formed of an organic material have better brightness, lower driving voltage, and faster response time than inorganic light emitting display apparatuses, while providing multicolored images.

An OLED display apparatus includes an organic emissive device having a cathode and an anode placed in conjunction with an organic emissive layer. When a voltage is applied between the cathode and the anode, visible lights are obtained by the organic emissive layer connected to the cathode and the anode. Since electric charges are supplied to the organic emissive layer via the cathode and the anode, the contact between the organic emissive layer and the cathode or the anode influences the optical properties of the OLED display apparatus.

SUMMARY

Embodiments are therefore directed to an OLED display apparatus and method of manufacturing the same.

It is therefore a feature of an embodiment to provide an OLED display apparatus that enables an organic emissive layer to be easily formed.

It is therefore another feature of an embodiment to provide an OLED display apparatus that has excellent image quality by preventing any detached spaces between the organic emissive layer and a first electrode from occurring.

At least one of the above and other features and advantages may be realized by providing an OLED display apparatus including a substrate, at least one thin film transistor (TFT) on the substrate, an insulating layer covering the at least one TFT and having a via hole and a groove, a first electrode on the insulating layer and electrically connected to the at least one TFT through the via hole, a pixel define layer on the first electrode and the groove, the pixel define layer having an opening that exposes the first electrode, an intermediate layer electrically connected to the first electrode through the opening, the intermediate layer including an organic emissive layer and, a second electrode on the intermediate layer.

It is therefore another feature of an embodiment to provide an OLED display apparatus where a portion of the pixel define layer may fill the groove.

The groove may be between two adjacent TFTs.

A plurality of the grooves may be between two adjacent TFTs.

The groove may have a depth of about 0.5 μm to about 1.5 μm.

The groove may extend horizontally on the insulating layer.

At least one of the above and other features and advantages may also be realized by providing a method of manufacturing an OLED display apparatus, the method including preparing a substrate, forming at least one TFT on the substrate, forming an insulating layer to cover the at least one TFT, forming a via hole and a groove in the insulating layer, forming a first electrode on the insulating layer and electrically connected to the at least one TFT through the via hole, forming a pixel define layer on the first electrode, the pixel define layer having an opening that exposes the first electrode, forming an intermediate layer electrically connected to the first electrode through the opening, the intermediate layer including an organic emissive layer and, forming a second electrode on the intermediate layer.

The intermediate layer may be formed using a thermal transfer method.

The via hoe and the groove may be simultaneously patterned using a single mask.

A portion of the pixel define layer may fill the groove.

The groove may be formed between two adjacent TFTs.

A plurality of grooves may be formed between two adjacent TFTs.

The groove may extend horizontally on the insulating layer.

The groove may have a depth of about 0.5 μm to about 1.5 μm.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
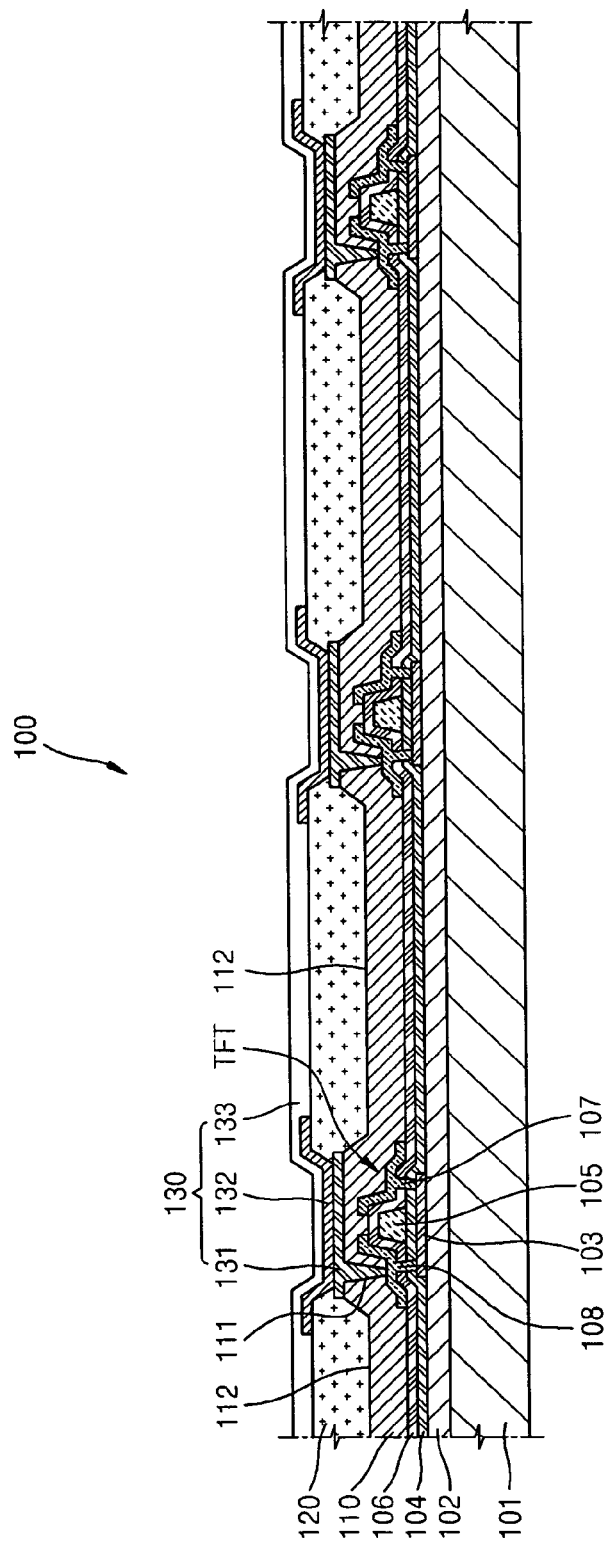
FIG. 1 illustrates a cross-sectional view of an OLED display apparatus according to an embodiment.

Korean Patent Application No. 10-2008-0067829, filed on Jul. 11, 2008, in the Korean Intellectual Property Office, and entitled "Organic Light Emitting Display Apparatus and Method of Manufacturing the Same", is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, the present invention will be described in detail by explaining exemplary embodiments of the invention with reference to the attached drawings.

FIG. 1 illustrates a cross-sectional view of an OLED display apparatus 100 according to an embodiment. The OLED display apparatus 100 may include a substrate 101, a thin film transistor (TFT), an insulating layer 110, an organic emissive device 130, and a pixel define layer 120. The organic emissive device 130 may include a first electrode 131, an intermediate layer 132, and a second electrode 133.

The substrate 101 may be formed of a transparent glass material having $SiO_2$ as a main component. A material for forming the substrate 101 may not be limited to the transparent glass and may be a transparent plastic material. The transparent plastic material may be an insulating organic material that may include at least one of polyethersulfone (PES), polyacrylate (PAR), polyetherimide (PEI), polyethylene naphthalate (PEN), polyethyleneterepthalate (PET), polyphenylene sulfide (PPS), polyallylate, polyimide, polycarbonate (PC), cellulose triacetate (TAC) and cellulose acetate propionate (CAP).

In a bottom-emission type OLED display apparatus where images are realized toward the substrate 101, the substrate 101 may be formed of a transparent material. In a top-emission type OLED display apparatus where images are realized toward an opposite direction of the substrate 101, the substrate 101 may not be required to be formed of a transparent material. That is, the substrate 101 may be formed of a metal layer, e.g., a metal foil. In this case, the substrate 101 may include at least one of iron, chromium, manganese, nickel, titanium, molybdenum, steel use stainless (SUS), Invar alloy, Inconel alloy, or Kovar alloy, but is not limited thereto.

A buffer layer 102 may be formed on the substrate 101 to make the substrate 101 smooth and to prevent the penetration of impurities into the substrate 101. The buffer layer 102 may be formed of $SiO_2$ and/or SiNx.

The TFT may be formed on the buffer layer 102. At least one TFT may be formed for each pixel and may be electrically connected to the organic emissive device 130. For convenience of description, three TFTs are illustrated in FIG. 1, but the embodiment is not limited thereto.

In particular, an active layer 103 having a predetermined pattern may be formed on the buffer layer 102. The active layer 103 may be formed of an inorganic semiconductor, e.g., amorphous silicon or polysilicon, or an organic semiconductor, and may include a source region, a drain region, and a channel region.

The source and the drain regions may be formed by doping the active layer 103 formed of amorphous silicon or polysilicon with impurities. For example, the active layer 103 may be doped with boron, an element of Group 3, thereby forming a p-type semiconductor. The active layer 103 may be doped with nitrogen, an element of Group 5, thereby forming an n-type semiconductor.

A gate insulating layer 104 may be formed on the active layer 103. The gate insulating layer 104 may be formed of an organic material or an inorganic material, e.g., SiNx or $SiO_2$ and may insulate the active layer 103 from a gate electrode 105.

The gate electrode 105 may be formed on a predetermined portion of the gate insulating layer 104. The gate electrode 105 may be formed of a metal or a metal alloy, e.g., Au, Ag, Cu, Ni, Pt, Pd, Al, Mo, Al:Nd alloy, or Mo:W alloy, but is not limited thereto. That is, the gate electrode 105 may be formed of various materials after considering various factors, e.g., adhesion with adjacent layers, a surface flatness of a staked layer, electrical resistance, plasticity, or the like. The gate electrode 105 may be connected to a gate line (not shown) supplying on/off signals to the TFT.

An inter-layer insulating layer 106 may be formed on the gate electrode 105. The inter-layer insulating layer 106 may have contact holes that partially expose the active layer 103. The contact holes may be formed by partially etching the inter-layer insulating layer 106 and the gate insulating layer 104. A source electrode 107 and a drain electrode 108 may contact the source region and the drain region of the active layer 103, respectively, via the contact holes. The source electrode 107 and the drain electrode 108 may be formed of a metal, e.g., Au, Pd, Pt, Ni, Rh, Ru, Ir, Os, Al, Mo, or a metal alloy composed of two or more metals, e.g., Al:Nd alloy or MoW alloy, but is not limited thereto.

The TFT may be protected by the insulating layer 110. The insulating layer 110 may be an inorganic insulating layer and/or an organic insulating layer. The inorganic insulating layer may include $SiO_2$, SiNx, SiON, $Al_2O_3$, $TiO_2$, $Ta_2O_5$, $HfO_2$, $ZrO_2$, BST, PZT, or the like. The organic insulating layer may include a general polymer (e.g., PMMA or PS), a phenol group-containing polymer derivative, an acrylic polymer, an imide-based polymer, an arylether-based polymer, an amide-based polymer, a fluorine-based polymer, a p-xylene-based polymer, a vinylalcohol-based polymer, or a blend thereof. The insulating layer 110 may be formed as a composite stack including the inorganic insulating layer and the organic insulating layer.

The insulating layer 110, though not shown, may have a multi-layered structure. That is, the insulating layer 110 may include a passivation layer covering the TFT and a planarization layer formed on the passivation layer. The passivation layer may be formed of the material that is used to form the insulating layer 110, and the planarization layer may be formed of an acrylic polymer or the like. If the insulating layer 110 is formed of a plurality of layers, a groove 112 may be formed on a planarization layer, which is an upper insulating layer.

The insulating layer 110 may have a via hole 111 in addition to the groove 112. The via hole 111 may be formed to expose the TFT. Referring to FIG. 1, the drain electrode 108 may be exposed through the via hole 111.

The groove 112 may be formed on the insulating layer 110 using a conventional etching method. The groove 112 may have a predetermined depth such that the groove 112 does not expose the TFT. The depth of the groove 112 may be greater than about 0.5 µm. If the depth of the groove 112 is less than about 0.5 µm, a portion of the pixel define layer 120 filled in the groove 112 may be reduced.

The depth of the groove 112 may be less than about 1.5 µm. If the depth of the groove 112 is greater than about 1.5 µm, the groove 112 may influence the TFT formed below the insulating layer 110.

Referring to FIG. 1, the groove 112 may be formed between adjacent TFTs. As illustrated in FIG. 1, the single grove 112 may be formed between two adjacent TFTs. A plurality of grooves 112, however, may be formed between the adjacent TFTs.

The top of the groove 112 may be in various shapes, e.g., quadrangle, circle, or the like. Even though the bottom surface of the groove 112 is illustrated flat in FIG. 1, the bottom surface of the groove 12 is not limited thereto and may have a variety of shapes. That is, concaves and convexes may be formed on the bottom surface of the groove 112.

The first electrode 131, an anode electrode of the organic emissive device 130, may be formed on the insulating layer 110. The first electrode 131 may fill the via hole 111, and thus, in direct contact with the TFT, e.g., the drain electrode 108.

The pixel define layer 120 may be formed using an insulating material on the first electrode 131 to cover the first electrode 131. An opening may be formed in the pixel define layer 120 to expose the first electrode 131. The intermediate layer 132 of the organic emissive device 130 may be formed on the first electrode 131 exposed through the opening, e.g., covering the opening formed on the pixel define layer 120. The intermediate layer 132 may be formed along, e.g., including the sides thereof, the opening and may extend to the top of the pixel define layer 120. Then, the second electrode 133, a cathode electrode of the organic emissive device 130, may be formed to cover all pixels, e.g., covering both the pixel define layer 120 and the intermediate layer 132.

In a top emission type OLED display apparatus where images are realized toward the second electrode 133, the first electrode 131 may be formed as a reflective electrode and the second electrode 133 may be formed as a transparent electrode. The reflective electrode serving as the first electrode 131 may be formed of e.g., Ag, Mg, Al, Pt, Pd, Au, Ni, Nd, Ir, Cr, Li, Ca or a compound thereof to form a reflective layer.

The transparent electrode serving as the second electrode 133 may be formed by depositing a material with a low work function, e.g., Ag, Mg, Al, Pt, Pd, Au, Ni, Nd, Ir, Cr, Li, Ca or a compound thereof, and then, by forming an auxiliary electrode layer or a bus electrode line using a transparent conductive material, e.g., ITO, IZO, ZnO, or $In_2O_3$.

In a double side emission type OLED display apparatus, both the first electrode 131 and the second electrode 133 may be formed as transparent electrodes.

In a bottom emission type OLED display apparatus where images are realized toward the substrate 101, the first electrode 131 may be formed as a transparent electrode, and the second electrode 133 may be formed as a reflective electrode. The first electrode 131 may be formed of a material with a high work function, e.g., ITO, IZO, ZnO, or $In_2O_3$, and the second electrode 133 may be formed of a material with a low work function, e.g., Ag, Mg, Al, Pt, Pd, Au, Ni, Nd, Ir, Cr, Li, or Ca. The first electrode 131 may be a cathode electrode, and the second electrode 133 may be an anode electrode.

A material of the first electrode 131 and the second electrode 133 may not be limited to the above described materials, and the first electrode 131 and the second electrode 133 may be formed of a conductive organic material or a conductive paste including conductive particles, e.g., Ag, Mg, or Cu. When the conductive paste is used, the first electrode 131 and the second electrode 133 may be formed by printing the conductive paste using inkjet printing, and then, baking the conductive paste. In addition, the polarities of the first electrode 131 and the second electrode 133 may be changed. For example, the first electrode 131 may be an anode electrode, and the second electrode 133 may be a cathode electrode.

The pixel define layer 120 may be formed on the groove 112 to fill the groove 112. Since the portion of the pixel define layer 120 fills the groove 112, a step, i.e., distance between the top surface of the first electrode 131 and the top surface of the pixel define layer 120, between first electrode 131 and the pixel define layer 120 may be reduced.

The intermediate layer 132 interposed between the first electrode 131 and the second electrode 133 may include an organic emissive layer that emits visible lights. The intermediate layer 132 may emit lights by electrical operations of the first electrode 131 and the second electrode 133.

The intermediate layer 132 may be formed on the first electrode 131 through the opening of the pixel define layer 120. That is, the intermediate layer 132 may be formed on the first electrode 131 exposed by the opening of the pixel define layer 120 and along the sides of the opening. Further, the intermediate layer 132 may extend to the top surface of the pixel define layer 120.

The contact between the intermediate layer 132 and the first electrode 131 may influence luminescent properties of the organic emissive device 130. That is, if there is any detached space in the contact area between the intermediate layer 132 and the first electrode 131, regions corresponding to that detached space may have low light emitting efficiency. Therefore, the regions may remain as non-emissive regions or as low brightness regions and luminescent properties of the pixels including those regions may be reduced.

Such problems may be particularly generated at edge portions of the opening. That is, the detached space may be generated in the regions of the opening of the pixel define layer 120, where the first electrode 131 contacts the pixel define layer 120, e.g., each bottom corners of the opening. In those regions, the intermediate layer 132 may not make an appropriate contact with the first electrode 131 and may have the detached space between the two.

Since the intermediate layer 132 may be formed on the first electrode 131 and the pixel define layer 120, i.e., formed on two features with different height, the intermediate layer 132 may have a step. The step may be a distance between a portion of the intermediate layer 132 formed on the first electrode 131 and a portion of the intermediate layer 132 formed on the pixel define layer 120. The intermediate layer 132 may bend due to the step. The bend portion of the intermediate layer 132 may be formed at the contact regions between the first electrode 131 and the pixel define layer 120 in the opening of the pixel define layer 120. Since contact quality with the first electrode may deteriorate when the intermediate layer 132 bends, the intermediate layer 132, especially the portion where it is bent, may become detached from the first electrode 131.

As the step, i.e., the distance between the top surface of the first electrode 131 and the surface of the pixel define layer 120, between the first electrode 131 and the pixel define layer 120 increases, the luminescent properties of the pixels may be more reduced because contact quality between the intermediate layer 132 and the first electrode 131 further deteriorates.

To overcome such problems, a method of reducing the overall thickness of the pixel define layer 120 may be suggested. Due to properties of the materials used to form the pixel define layer 120, however, it may be difficult to maintain the uniform thickness when the thickness of the pixel define layer 120 is reduced. Furthermore, if the thickness of the pixel define layer 120 becomes too thin, insulating properties of the pixel define layer 120 may decrease.

According to the current embodiment, the groove 112 may be formed on the insulating layer 110. The pixel define layer 120 may be formed on the groove 112. A significant portion of the pixel define layer 120 may fill the groove 112. The significant portion of the pixel define layer 120 may be the portion of at least about 0.5 µm to less than about 1.5 µm. The entire pixel define layer 120 may not fill the groove 112.

By using the groove 112, the step between the first electrode 131 and the pixel define layer 120, i.e., the distance between the top surface of the first electrode 131 and the top surface of the pixel define layer 120, may be reduced, even though the overall thickness of the pixel define layer 120 may not be reduced. Thus, the step of the intermediate layer 132 may also be reduced. That is, the height difference between the top surface of the intermediate layer 132 on the first electrode 131 and the top surface of the intermediate layer 132 on the pixel define layer 120 may be reduced.

Since the amount of the material used to form the pixel define layer 120 is not significantly changed in the current embodiment, the overall thickness of the pixel define layer 120 may not be changed. Therefore, insulating properties and dielectric properties of the pixel define layer 120 may not decrease. In addition, since the thickness of the pixel define layer 120 is not reduced, the uniformity of the thickness of the pixel define layer 120 may easily be maintained, thereby preventing deterioration of the contact quality between the intermediate layer 132 and the first electrode 131.

The intermediate layer 132 may be formed of an organic material. If the organic emissive layer of the intermediate layer 132 is formed of a low molecular weight organic material, the intermediate layer 132 may include a hole transport layer (HTL) and a hole injection layer (HIL) which are sequentially stacked in a direction toward the first electrode 131 with respect to the organic emissive layer, and may also include an electron transport layer (ETL) and an electron injection layer (EIL) which are sequentially stacked in a direction toward the second electrode 133 with respect to the organic emissive layer. In addition, various additional layers may be formed in the intermediate layer 132 if necessary. The organic material used to form the intermediate layer 132 may be copper phthalocyanine (CuPc), N,N'-Di(naphthalene-1-yl)-N,N'-diphenyl-benzidine (NPB), tris-8-hydroxyquinoline aluminum (Alq3), or the like.

If the organic emissive layer of the intermediate layer 132 is formed of a high molecular weight organic material, the intermediate layer 132 may only include the HTL in a direction toward the first electrode 131 with respect to the organic emissive layer. The polymer HTL may be formed of poly-(2, 4)-ethylene-dihydroxy thiophene (PEDOT), polyaniline (PANI), or the like, and may be formed on the first electrode 131 by using ink jet printing or spin coating. The polymer organic emissive layer may be formed of PPV, soluble PPV's, cyano-PPV, polyfluorene, or the like. A color pattern may be formed using a conventional method, e.g., ink jet printing, spin coating, or a thermal transfer method with a laser.

A sealing member (not shown) may be formed to face a surface of the substrate 101. The sealing member may protect the organic emissive device 130 from external moisture or oxygen, and may be formed of a transparent material. The sealing member may be a glass substrate, a plastic substrate, or a multi-layered structure including organic and inorganic materials.

FIGS. 2 to 9 illustrate cross-sectional views of stages in a method of manufacturing an OLED display apparatus according to an embodiment.

In particular, the method of manufacturing an OLED display apparatus according to FIGS. 2 to 9 may be applied to the OLED display apparatus 100 shown in FIG. 1. The method, however, is not limited thereto. For descriptive convenience, the method of manufacturing the OLED display apparatus 100 of FIG. 1 will be described herein.

Figure 2:
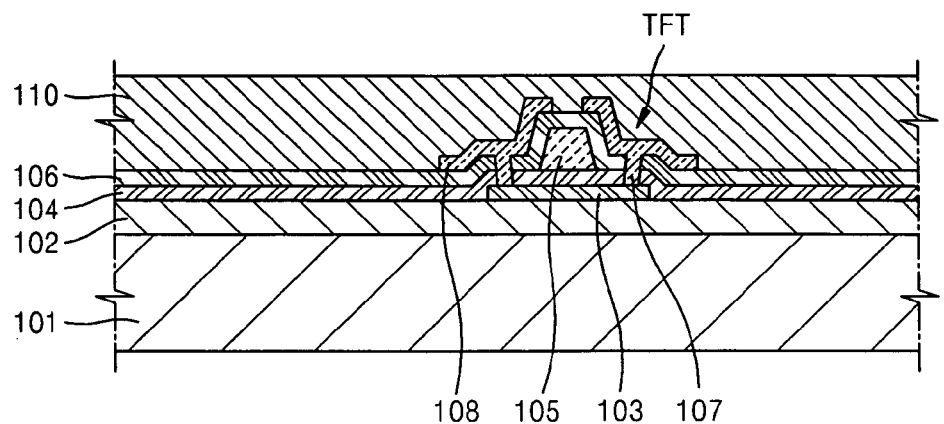
FIGS. 2 to 9 illustrate cross-sectional views of stages in a method of manufacturing an OLED display apparatus according to an embodiment.

Referring to FIG. 2, the TFT may be formed on the substrate 101, the insulating layer 110 may be formed to protect the TFT. For descriptive convenience, FIG. 2 illustrates only one TFT. The present embodiment, however, is not limited thereto, and a plurality of TFTs may be formed on the substrate 101.

In particular, the buffer layer 102 may be formed on the substrate 101, and the active layer 103 may be formed on the buffer layer 102. The gate insulating layer 104 may be formed on the active layer 103, and the gate electrode 105 may be formed on the gate insulating layer 104. The inter-layer insulating layer 106 may be formed to cover the gate electrode 105. The source electrode 107 and the drain electrode 108 may be connected to the active layer 103 through the contact hole formed on the inter-layer insulating layer 106. Materials used to form the layers have been described above with reference to FIG. 1, and thus, detailed description thereof will be omitted.

The TFT may be protected by the insulating layer 110. The insulating layer 110 may be formed of various insulating materials described above with reference to FIG. 1.

Figure 3:
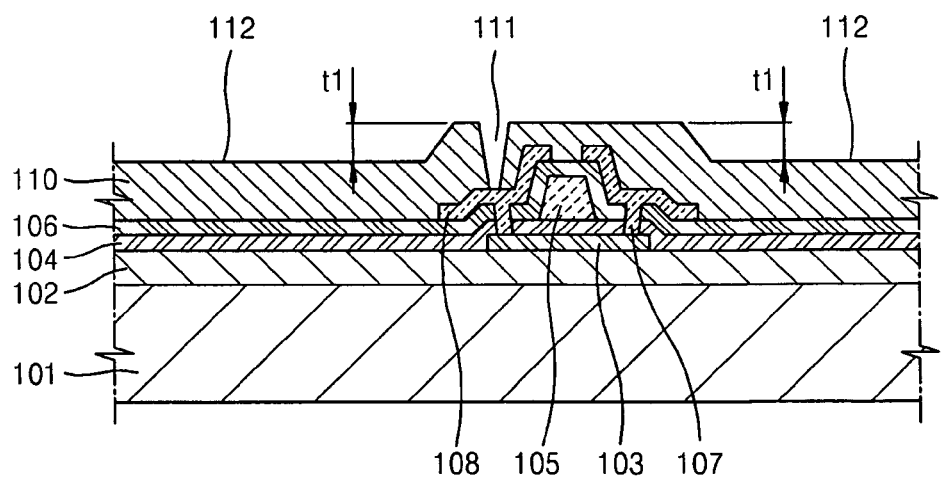

Referring to FIG. 3, the via hole 111 and the groove 112 may be formed on the insulating layer 110. The via hole 111 may be formed to expose the TFT, e.g., drain electrode 108.

The groove 112 may be formed to have an appropriate depth t1. The depth t1 of the groove 112 may be greater than about 0.5 µm. If the depth t1 of the groove 112 is less than about 0.5 µm, the portion of the pixel define layer 120 filled in the groove 112 may be too low.

In addition, the depth t1 of the groove 112 may be less than about 1.5 µm. If the depth t1 of the groove 112 is greater than about 1.5 µm, the TFT formed below the insulating layer may be influenced.

The groove 112, though not shown, may be formed, e.g., extending horizontally on the insulating layer 110, between two adjacent TFTs. In addition, a plurality of grooves 112 may be formed between the adjacent TFTs.

The groove 112 and the via hole 111 may be independently patterned, or may be simultaneously patterned using a single mask. To simultaneously pattern the groove 112 and the via hole 111, the mask having a half-tone pattern corresponding to the groove 112 may be used. The top surface of the groove 112 may be formed with various shapes, e.g., quadrangle, circle, or the like. The bottom surface of the groove 112 may be flat or uneven, e.g., concaves and convexes.

Figure 4:
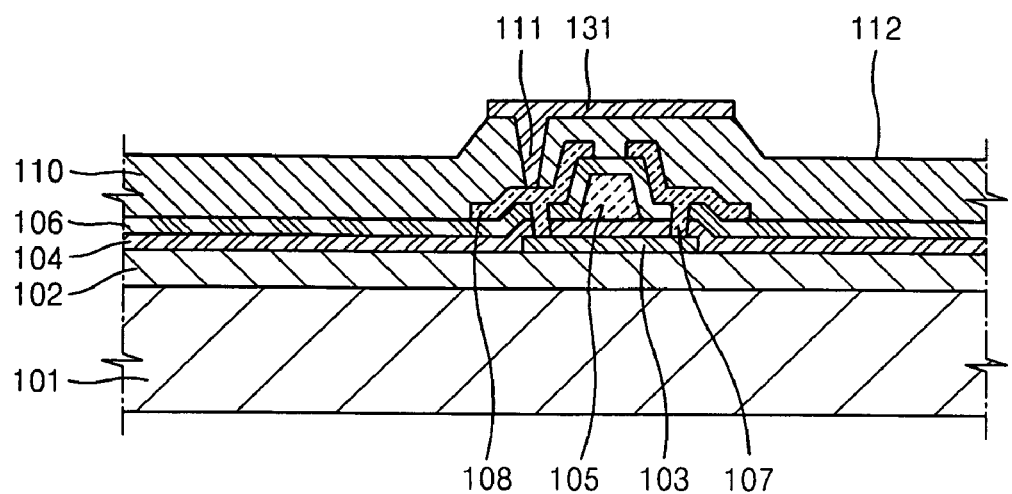

Referring to FIG. 4, the first electrode 131 may be formed to be connected to the drain electrode 108 through the via hole 111. The first electrode 131 may be formed in a predetermined pattern by photolithography. In a passive matrix (PM) type OLED display apparatus, the first electrode 131 may be formed in a stripe pattern. In an active matrix (AM) type OLED display apparatus, the first electrode 131 may be formed to correspond to a pixel. The first electrode 131 may be connected to the drain electrode 108 through the via hole 111.

Materials used to form the first electrode 131 and the constitution of the first electrode 131 have already been described above with reference to FIG. 1, and thus, detailed description thereof will be omitted.

Figure 5:
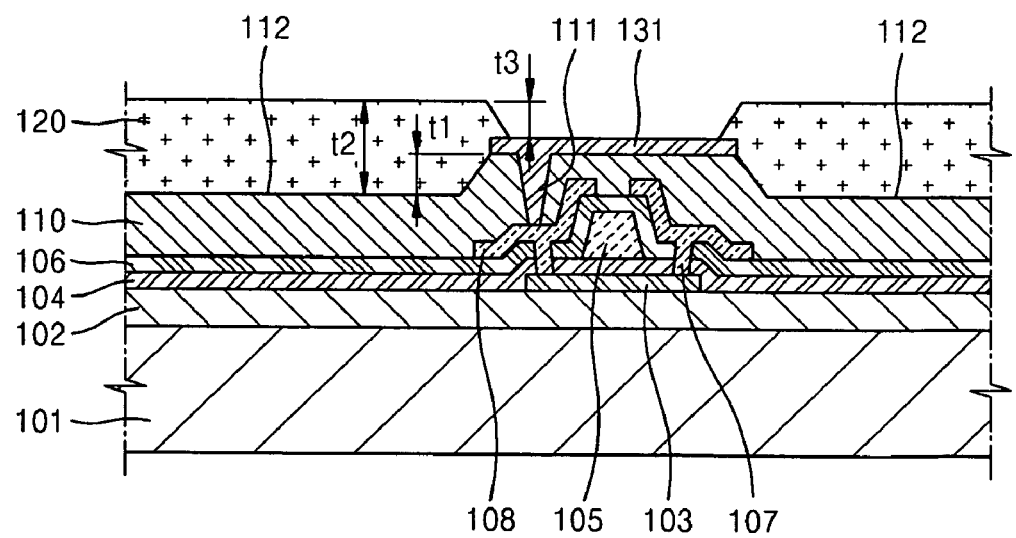

Referring to FIG. 5, the pixel define layer 120 may be formed on the first electrode 131. The amount of the material used to form the pixel define layer 120 may be, e.g., the same as the amount being conventionally used. A portion of the pixel define layer 120 may fill the groove 112. Since a portion of the pixel define layer 120 fills the groove 112, the step between the first electrode 131 and the pixel define layer 120, i.e., the distance t3 between the top surface of the first electrode 131 and the top surface of the pixel define layer 120, may be significantly reduced. For example, the step between the first electrode 131 and the pixel define layer 120 may be reduced by at least a distance t1, which is the depth of the groove 112. In addition, a distance t3 may be the distance between the top surface of the first electrode 131 and the line that extends from the top surface of the pixel define layer 120.

The pixel define layer 120 may have an overall thickness t2. Since the amount of material used to form the pixel define layer 120 is not reduced, the thickness t2 of the pixel define layer 120 may be, e.g., similar to the thickness of a conventional pixel define layer.

Figure 6:
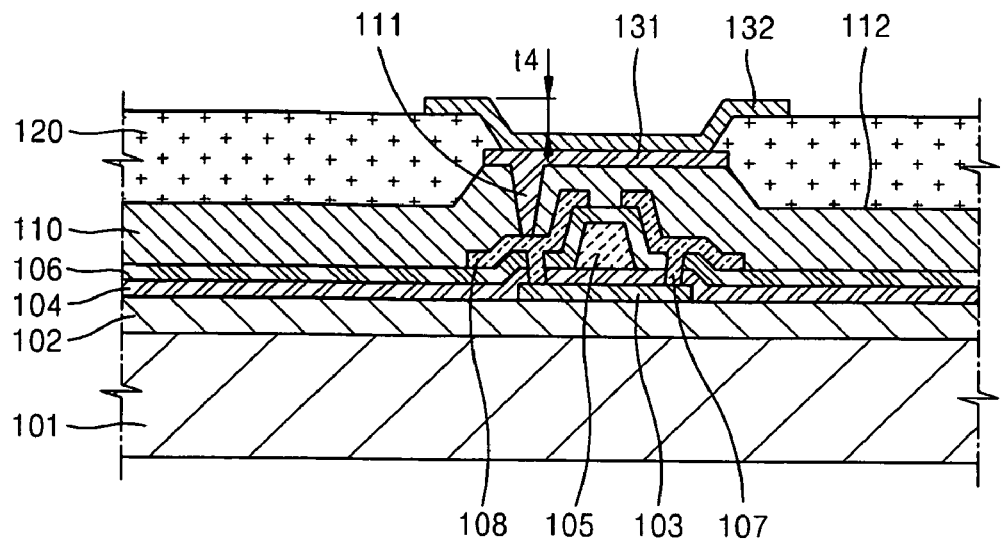

Referring to FIG. 6, the intermediate layer 132 may be formed on the first electrode 131 exposed through the opening of the pixel define layer 120. The intermediate layer 132 may include the organic emissive layer. Since the distance t3 between the first electrode 131 and the pixel define layer 120 is reduced, the step t4 of the intermediate layer 132, i.e., the height difference between the top surface of the intermediate layer 132 formed on the first electrode 131 and the top surface of the intermediate layer 132 formed on the pixel define layer 120, may be reduced.

Because of the reduced step t4, the intermediate layer 132 may easily make contact with the first electrode 131 at the bend regions of the opening, e.g., regions where the pixel define layer 120 and the first electrode 131 meet, and may be prevented from being detached from the first electrode 131.

Figure 7:
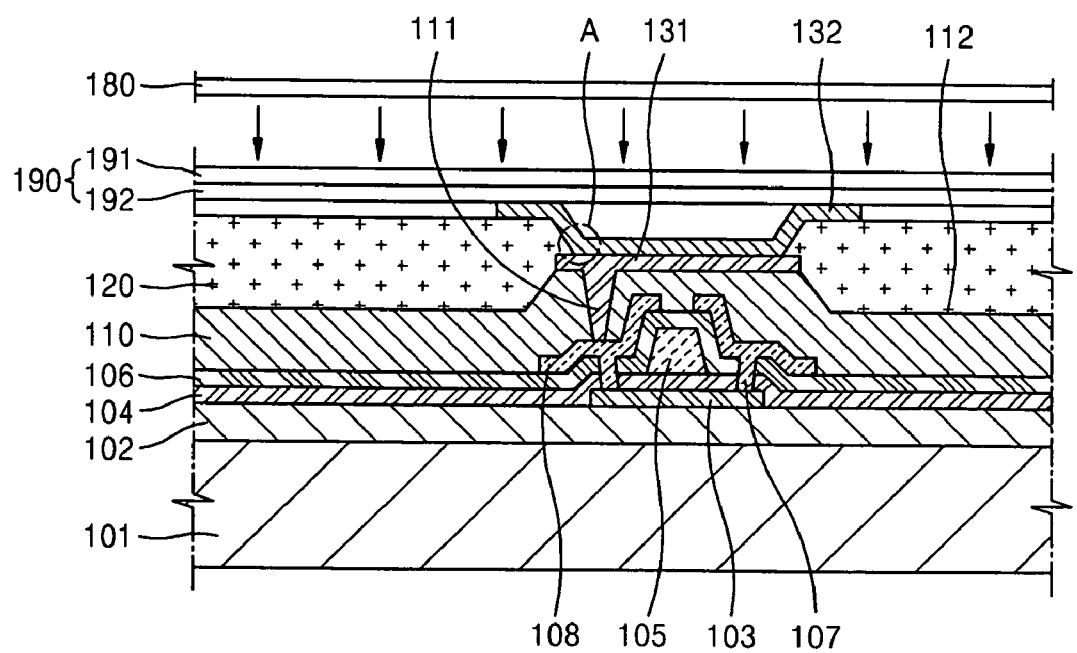

In particular, if the intermediate layer 132 is formed using a thermal transfer method, the effect of preventing the intermediate layer 132 from being detached from the first electrode 131 may further increase. FIG. 7 illustrates a cross-sectional view of the formation of the intermediate layer 132 using a thermal transfer method.

A heat source 180 and a donor film 190 for thermal transfer may be arranged above the pixel define layer 120 after the pixel define layer 120 is formed.

The heat source 180 may include a laser irradiation device. The heat source 180 may further include a mask (not shown) and a lens (not shown) to irradiate laser beams to a desired region.

The donor film 190 may include a base film 191 and a light-to-heat conversion layer 192. The intermediate layer 132, which is a transfer layer, may be attached to the bottom surface of the donor film 190.

The heat source 180 may irradiate laser beams to the top surface of the donor film 190. Then, the intermediate layer 132 as the transfer layer may be detached from the donor film 190 and may be transferred to the first electrode 131. The intermediate layer 132 may be transferred to a desired region of the first electrode 131 using a mask (not shown).

Conventionally, when the intermediate layer 132 is transferred using a thermal transfer method, there may be regions in the intermediate layer 132 that may detach from the first electrode 131. In particular, since the intermediate layer 132 may be detached from the first electrode at edges of the opening where it is bent, this phenomenon is referred to as an edge open.

The edge open may be caused by the step between the first electrode 131 and the pixel define layer 120. Due to the step, the intermediate layer 132 may bend. At the regions where the intermediate layer 132 bends, the intermediate layer 132 may not be properly transferred to the first electrode 131 and may be detached from the first electrode 131.

According to the present embodiment, however, the intermediate layer 132 may be prevented from being detached from the first electrode 131 by reducing the step of the intermediate layer 132 when the intermediate layer 132 is formed using a thermal transfer method.

Figure 8:
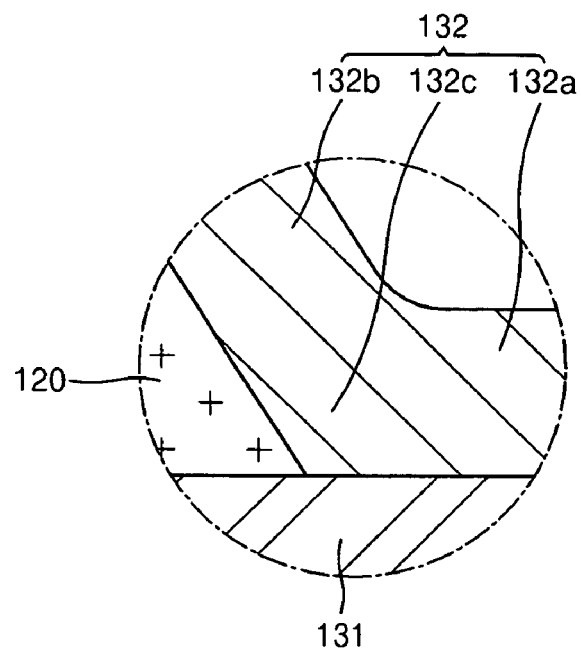

FIG. 8 illustrates a magnified view of a part A of FIG. 7. Referring to FIG. 8, the intermediate layer 132 may include a bottom 132a, a bend 132b, and a side 132c. The luminescent properties of the organic emissive device 130 may be influenced by the bottom 132a, which is in contact with the first electrode 131, and the bend 132b of the intermediate layer 132.

Conventionally, the luminescent properties of the organic emissive device 130 may not be sufficient when the intermediate layer 132 is formed using a thermal transfer method, since due to the step between the first electrode 131 and the pixel define layer 120 the intermediate layer 132, particularly the bend 132b of the intermediate layer 132, may often be detached from the first electrode 131.

According to the present embodiment, even though the thermal transfer method is used to form the bend 132b of the intermediate layer 132, the bottom 132a and the bend 132b may not be detached from the first electrode 131 and, thus, may be easily attached thereto as illustrated in FIG. 8.

According to the present embodiment, the step between the first electrode 131 and the pixel define layer 120 may be significantly reduced by forming the groove 112 on the insulating layer 110, which in turn may reduce the step of the intermediate layer 132. Therefore, the intermediate layer 132 may be easily transferred to the first electrode 131 and may not have any detached spaces from the first electrode 131.

Figure 9:
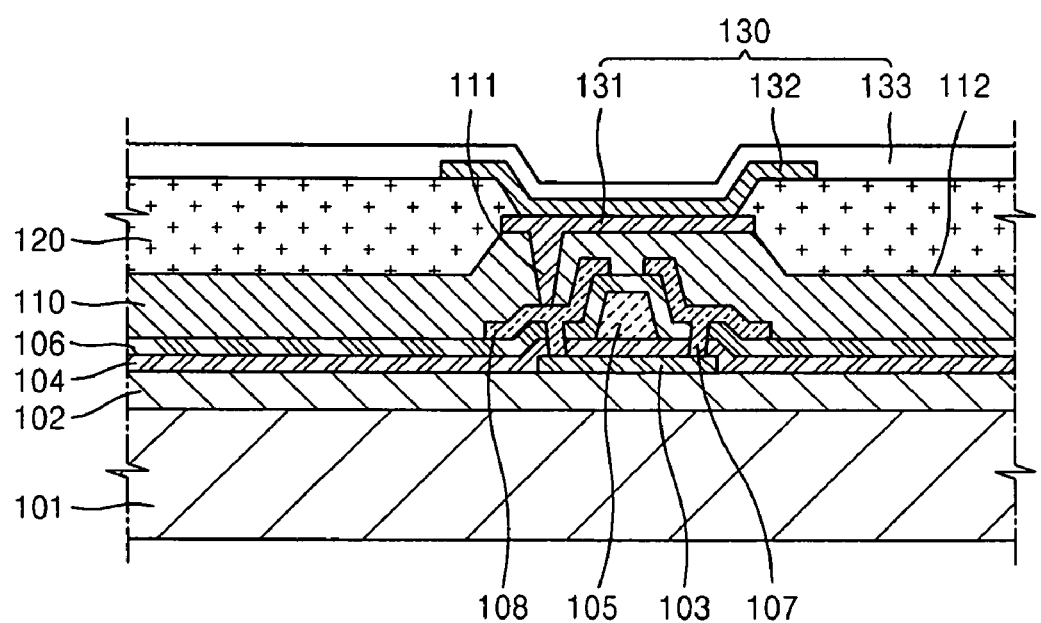

Referring to FIG. 9, the second electrode 133 may be formed on the intermediate layer 132. Materials used to form the intermediate layer 132 and the second electrode 133 have already been described above with reference to FIG. 1, and thus, detailed description thereof will be omitted.

The sealing member (not shown) may be formed to face the surface of the substrate 101. The sealing member may protect the organic emissive device 130 from external moisture or oxygen, and may be formed of a transparent material. For this, the sealing member may be a glass substrate, a plastic substrate, or a multi-layered structure including an organic material and an inorganic material.

In the OLED display apparatus and the method of manufacturing the OLED display apparatus according to the present embodiment, the step between the organic emissive layer and the pixel define layer may be reduced, and thus, the organic emissive layer may be easily formed in the opening and image quality may thereby be improved.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode (OLED) display apparatus, comprising:
    a substrate;
    a first thin film transistor (TFT) on the substrate;
    an insulating layer covering the first TFT and having a via hole and a groove, the groove extending between the first TFT and a second TFT, the second TFT being adjacent to the first TFT;
    a first electrode on the insulating layer and electrically connected to the first TFT through the via hole, the first electrode being patterned to cover a top surface of the insulating layer covering the first TFT without extending into the groove;
    a pixel define layer on the first electrode and the groove, wherein a portion of the pixel define layer completely fills the groove, the pixel define layer having a tapered opening that exposes the first electrode and such that the pixel define layer covers edge portions of the first electrode at the top surface of the insulating layer;
    an intermediate layer contacting to the first electrode through the tapered opening and covering a portion of the pixel define layer covering the edge portions of the first electrode, the intermediate layer including an organic emissive layer; and a second electrode on the intermediate layer.

2. The OLED display apparatus as claimed in claim 1, wherein the groove has a depth of about 0.5 µm to about 1.5 µm.

3. The OLED display apparatus as claimed in claim 1, wherein the groove extends horizontally on the insulating layer.

4. A method of manufacturing an organic light emitting diode (OLED) display apparatus, the method comprising:

preparing a substrate;

forming a first TFT on the substrate;

forming an insulating layer to cover the first TFT;

forming a via hole and a groove in the insulating layer, such that the groove extends between the first TFT and a second TFT, the second TFT being adjacent to the first TFT;

forming a first electrode on the insulating layer and electrically connected to the first TFT through the via hole, the first electrode being patterned to cover a top surface of the insulating layer covering the first TFT without extending into the groove;

forming a pixel define layer on the first electrode such that a portion of the pixel define layer completely fills the groove, the pixel define layer having a tapered opening that exposes the first electrode and such that the pixel define layer covers edge portions of the first electrode at the tip surface of the insulating layer;

forming an intermediate layer contacting the first electrode through the tapered opening and covering a portion of the pixel define layer covering the edge portions of the first electrode, the intermediate layer including an organic emissive layer; and forming a second electrode on the intermediate layer.

5. The method as claimed in claim 4, wherein the intermediate layer is formed using a thermal transfer method.

6. The method as claimed in claim 4, wherein the via hole and the groove are simultaneously patterned using a single mask.

7. The method as claimed in claim 4, wherein a portion of the pixel define layer is formed to fill the groove.

8. The method as claimed in claim 4, wherein the groove is formed to extend horizontally on the insulating layer.

9. The method as claimed in claim 4, wherein the groove has a depth of about 0.5 µm to about 1.5 µm.

* * * * *